(12) United States Patent
Chen (10) Patent No.: US 6,621,333 B1
(45) Date of Patent: Sep. 16, 2003

(54) CIRCUIT AND METHOD TO COUNTER OFFSET VOLTAGE INDUCED BY LOAD CHANGES

(75) Inventor: Sean S. Chen, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/014,728

(22) Filed: Dec. 11, 2001

(51) Int. Cl.[7] .................................................. H03F 1/02
(52) U.S. Cl. ........................... 330/9; 330/256; 330/265; 327/307
(58) Field of Search ............................. 330/9, 256, 265; 327/307

(56) References Cited

U.S. PATENT DOCUMENTS

| | | | | |
|---|---|---|---|---|
| 4,207,537 A | * | 6/1980 | Cave et al. ................... 330/253 |
| 4,896,121 A | * | 1/1990 | Larson ......................... 330/277 |
| 5,200,654 A | * | 4/1993 | Archer ......................... 327/362 |
| 5,352,989 A | * | 10/1994 | Toumazou et al. ........... 330/265 |
| 5,471,132 A | * | 11/1995 | Ryat ............................ 323/315 |
| 5,619,152 A | * | 4/1997 | Holtvoeth et al. ........... 327/110 |
| 5,677,561 A | * | 10/1997 | Jensen ......................... 257/469 |
| 5,986,840 A | * | 11/1999 | Tada et al. ................... 360/67 |
| 6,049,246 A | * | 4/2000 | Kozisek et al. ............. 330/253 |
| 6,166,566 A | * | 12/2000 | Strong ......................... 327/307 |

\* cited by examiner

Primary Examiner—Michael Tokar
Assistant Examiner—Linh V Nguyen
(74) Attorney, Agent, or Firm—Wagner, Murabito & Hao LLP (57) ABSTRACT

A circuit for countering offset voltage in an amplifier induced by changes in the output load. The circuit comprises an input stage, an output stage, and first and second current compensation stages. The first current compensation stage is coupled to the output stage and produces a first compensation current that is a function of the output current. The input stage is coupled to the first current compensation stage from which it receives the first compensation current. The input stage is configured to cause a change in the voltage between its input terminals in response to the first compensation current. The second current compensation stage produces a second compensation current, which is also fed into the input stage to act jointly with the first compensation current. The first compensation current may be linearly related to the output current. The second compensation current may be exponentially related to the output current.

18 Claims, 13 Drawing Sheets

CIRCUIT AND METHOD TO COUNTER OFFSET VOLTAGE INDUCED BY LOAD CHANGES

TECHNICAL FIELD

The present invention generally pertains to the field of electronic circuits. More particularly, the present invention is related to a scheme for compensating for changes in amplifier offset voltages caused by load changes.

BACKGROUND ART

Figure 1A:
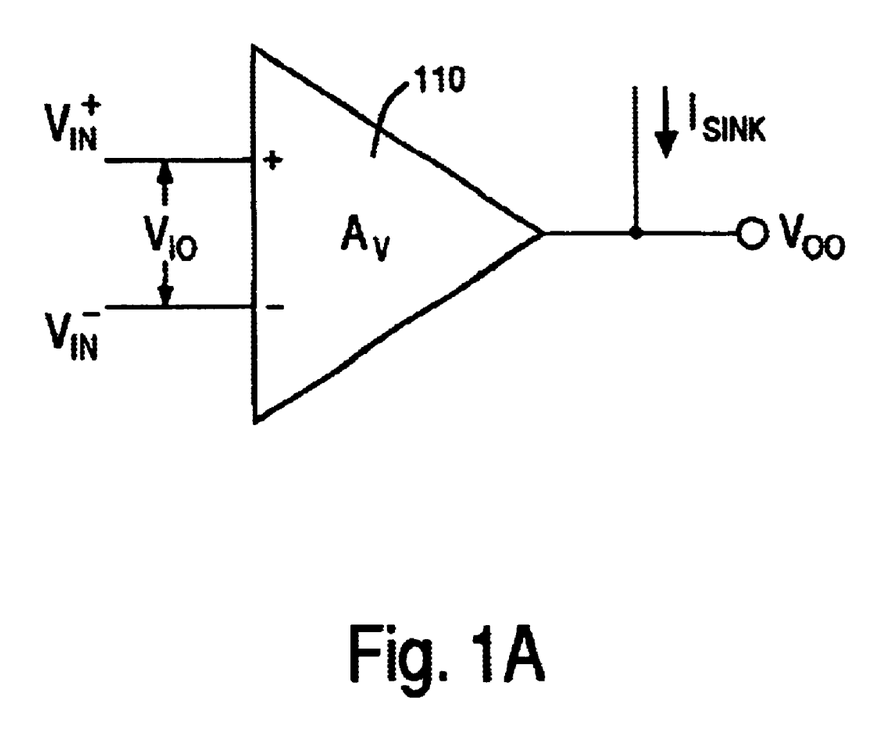
FIG. 1A is a block diagram an operational amplifier showing an offset voltage problem.

As is well understood, an operational amplifier is subject to voltage offset problems. For example, the amplifier 110 shown in FIG. 1A, has a output offset voltage Voo. This offset may be taken into account during analysis of closed loop configurations by referring it back to the input. Thus, the input offset voltage Vio may be obtained by dividing the output offset voltage by the open-loop gain of the amplifier (Av). Thus, the input offset voltage, which may be either negative or positive, may be defined as the voltage which needs to be applied between the input terminals to cause the output voltage to be zero volts (assuming the input terminals are tied together).

One technique for compensating for a DC offset problem is to capacitively couple the input of the amplifier. For example, by placing a capacitor between the negative input terminal and ground, the gain of the amplifier will be zero at DC. However, this technique is not possible if the amplifier is required to amplify DC signals or even low frequency signals.

A second technique for reducing an offset voltage is to increase the open-loop gain of the amplifier. However, to stabilize the amplifier and to change the phase margin, zeroes and poles may need to be added. Unfortunately, this requires the addition of resistors and capacitors. The added components not only increase the cost, but also take up additional chip real estate. This also applies in cases in which the op-amp is connected to external components to form another loop. External compensation would require more components to stabilize the loop if the open-loop gain of the op-amp is high. Saving chip real estate is especially critical when the application is intended for devices such as, cellphones, battery chargers, and other hand-held devices.

When compensating for offset voltages, a technique used to counter a relatively static offset voltage may not be effective to counter a dynamic offset voltage. Offset voltages may arise in many ways, with some factors leading to greater dynamic changes in the offset voltage than others. One cause of offset voltage is the amplifier configuration. In this case, the value of the offset voltage may be specified in the operational-amplifier's data sheet. Some conventional amplifiers are provided with additional terminals that may be used to reduce the offset voltage. However, this technique may be ineffective when dealing with a changing offset voltage. A second cause of offset voltage is device mismatches. While this presents a special problem in that the offset is not known a priori, the effect of device mismatches on offset voltage may be relatively constant (not factoring in temperature effects).

Figure 1B:
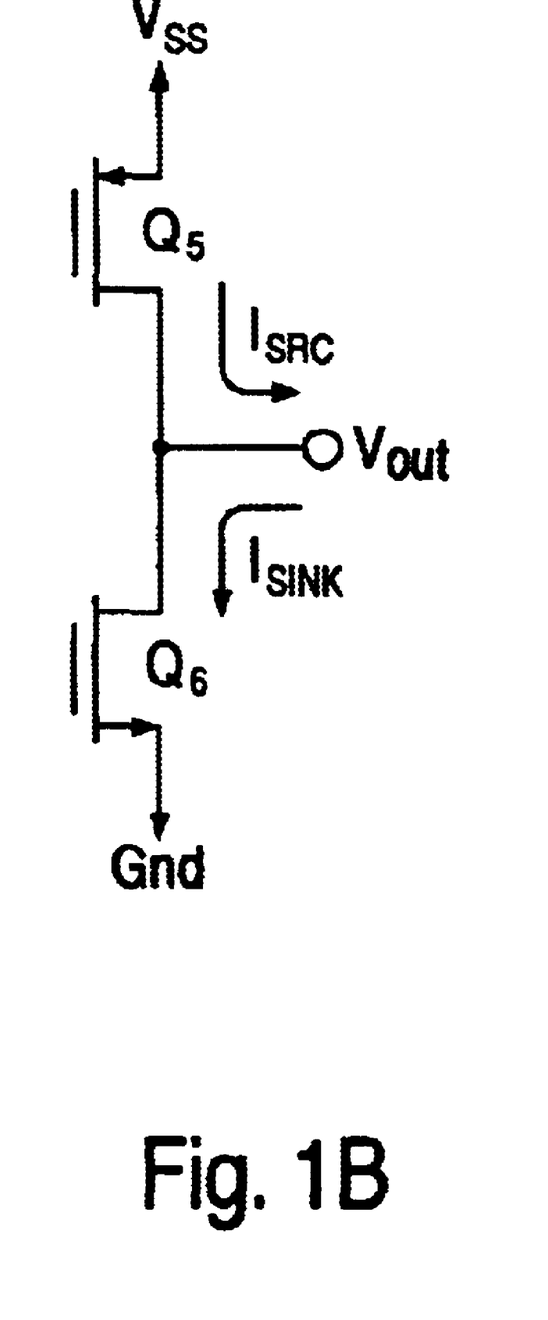
FIG. 1B is a schematic illustration of an output of an operational amplifier showing an offset voltage problem.

However, in some cases the offset voltage changes during circuit operation. For example, the offset voltage may be proportional to the output load. Referring to the simplified output stage of FIG. 1B, the output stage may be either sourcing or sinking a current. As the magnitude of, for example, the current being sourced increases, the voltage at the drain of transistor Q5 changes, which results in an offset voltage. In a similar fashion, as the amount of current being sunk by transistor Q6 changes, the voltage at the drain of transistor Q5 may change. Thus, the offset voltage changes in response to the amount of current being sourced or sunk by the output. Because the load may change during circuit operation, the amount of compensation needs changes over time.

Thus, a need has arisen for a technique for reducing offset voltage in an operational amplifier. A further need has arisen for such a technique which compensates for an offset voltage that varies due to changing output loads. A still further need has arisen for a technique which does not require increasing the open-loop gain of the amplifier to reduce the effect of the offset voltage. A still further need has arisen for a technique that is economical with respect to circuit component costs. A still further need has arisen for a technique that conserves chip real estate.

SUMMARY

The present invention provides a circuit for reducing offset voltage in an operational amplifier. Embodiments provide for techniques that compensate for an offset voltage that varies due to changing output loads. Embodiments provide for techniques that do not require increasing the open-loop gain of the amplifier to reduce the effect of the offset voltage. Embodiments provide for techniques that are economical and conserve chip real estate.

A circuit and method for countering offset voltage in an amplifier are disclosed. The circuit and method may be used to counter offset voltages induced by changes in output load. One embodiment comprises a method in which first an output current of an amplifier is sampled. A first compensation current which is a function of the output current is then created. The first compensation current is fed into an input stage of the amplifier to counter the offset voltage. Thus, changes to the offset voltage that are induced by changes in the output current are countered by the compensation current. In an additional embodiment, a second compensation current is created and fed into the input stage to act jointly with the first compensation current. In this fashion, higher order effects of the output current on the offset voltage may be countered. In one embodiment, the first compensation current is linearly related to the output current. In one embodiment, the second compensation current is exponentially related to the output current.

Another embodiment provides for a circuit for countering an offset voltage in an amplifier that is induced by changes to the output load. The circuit comprises an input stage, an output stage, and a first current compensation stage. Changes to an output current of the output stage may cause changes to the offset voltage. The first current compensation stage is coupled to the output stage and produces a first compensation current that is a function of the output current. The input stage is coupled to the first current compensation stage from which it receives the first compensation current. The input stage is configured such that the current injected into the input stage causes a change in the voltage between its input terminals.

In one embodiment, the circuit further comprises a second current compensation stage, which produces a second compensation current. The second compensation current is also fed into the input stage to act jointly with the first compensation current. In one embodiment, the first compensation current is linearly related to the output current. In one embodiment, the second compensation current is exponentially related to the output current.

These and other advantages of the present invention will no doubt become obvious to those of ordinary skill in the art after having read the following detailed description of the preferred embodiments which are illustrated in the various drawing figures.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 2A:
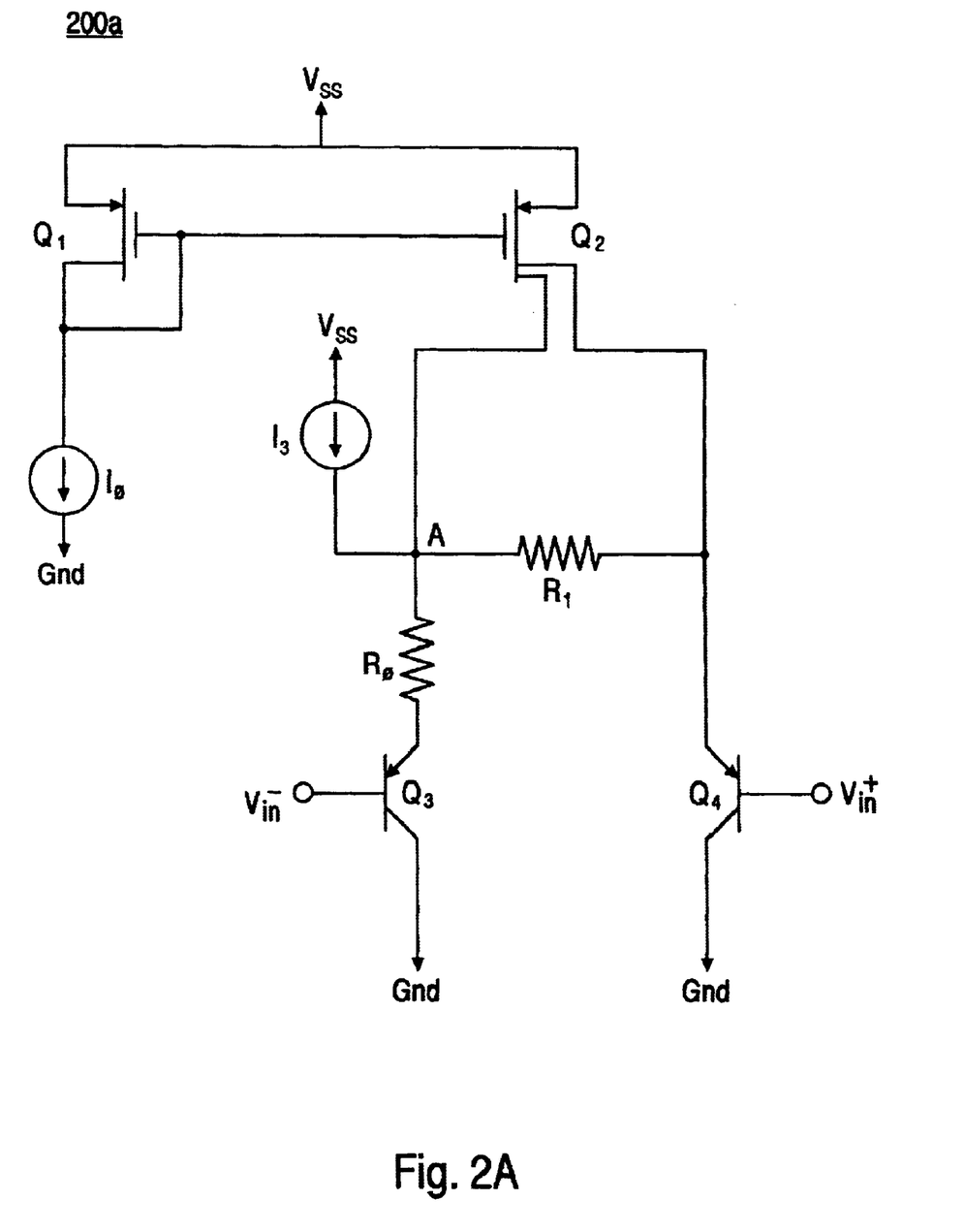
FIG. 2A is an input stage showing a current used to counter changes induced by output load changes, according to embodiments of the present invention.

Embodiments of the present invention comprise three or more stages: an input stage, an output stage, and one or more current compensation stages. There may also be other stages, such as, for example, an amplifier 20 stage, which may itself comprise multiple stages. FIG. 2A illustrates an input stage 200a having a current (e.g., first compensation current I3) that may serve to counter an offset voltage. Referring now to FIG. 2A, it is desired to change voltage at the input terminal of transistor Q3 (e.g., $V_{in}^-$) relative to the voltage at the input terminal of transistor Q4 (e.g., $V_{in}^+$) to compensate for an offset voltage. To accomplish this, compensation current I3 is fed into node A and divides between R0 and R1. However, compensation current I3 may be injected into a location other than node A. Current I3 may divide between R0 and R1 based on the relative sizes of the resistors. Suitable resistance values are selected for R0 and R1 to cause the voltage at the input of Q3 to change relative to the voltage at the input of transistor Q4. In this fashion, an offset voltage may be countered. Embodiments may be described as using current lead regulation to counter an offset voltage.

It will be understood that other configurations are suitable to counter an offset voltage by using the compensation current I3. More generally stated, the compensation current I3 is used to cause a change in the voltage difference between the input terminals ($V_{in}^+ - V_{in}^-$). Embodiments may change the voltage in either direction. This may be accomplished in any suitable fashion. For example, additional or fewer resistors may be used and may be in any suitable configuration to cause a change in the offset voltage by having the compensation current I3 flow through various elements. It may be stated that a circuit exists between the positive and negative input terminal and that portions of the compensation current I3 flow through portions of the circuit to cause changes to the offset voltage. The present invention is well suited to many different circuit configurations between the input terminals to effect such a change.

Still referring to FIG. 2A, a first transistor Q1 forms a current mirror with a second transistor Q2 having a double-drain. Transistor Q1 has current I0 going to ground. The current through each drain may be equal such that no current from Q2 flows through R1.

Figure 2B:
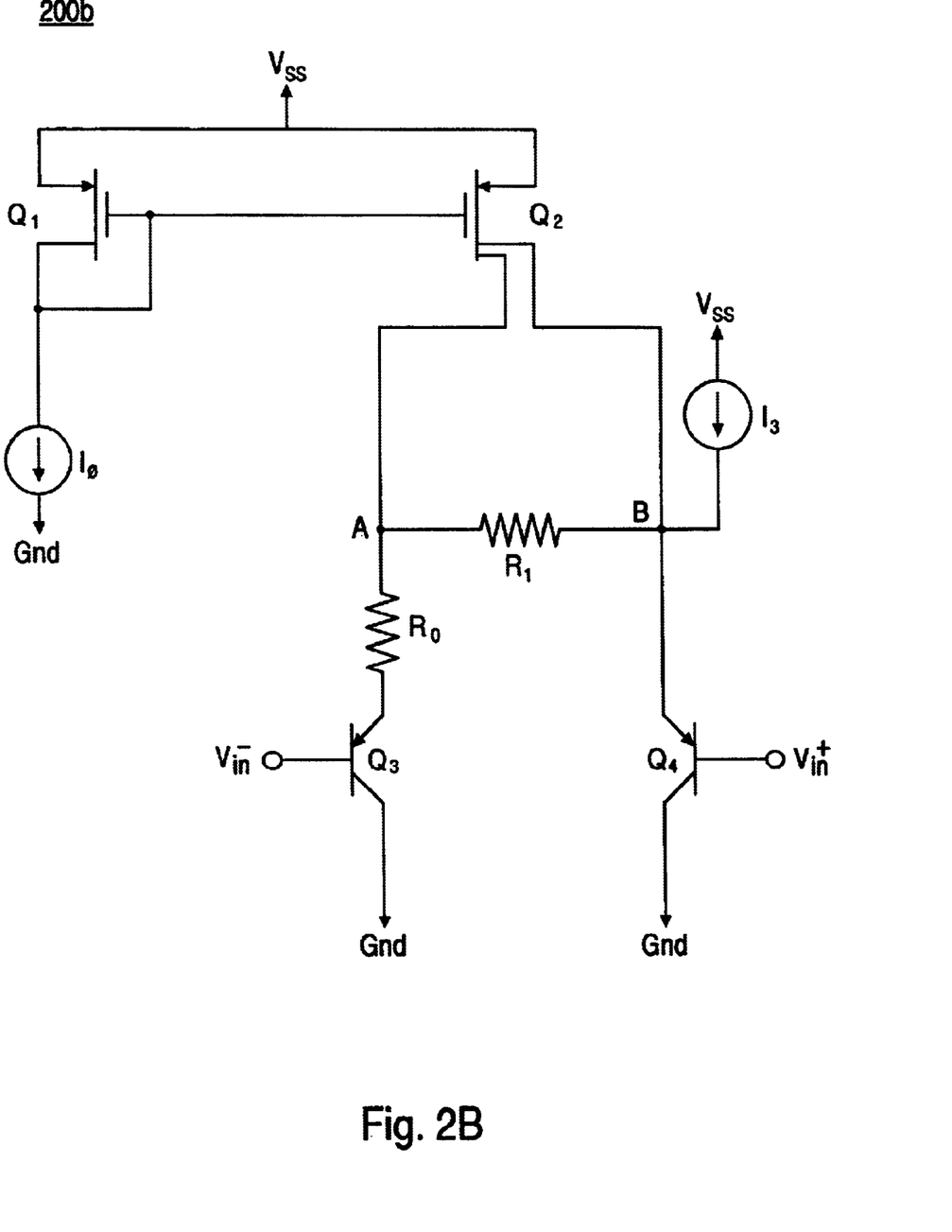
FIG. 2B is a schematic illustration of an input stage showing a current used to counter changes induced by output load changes, according to embodiments of the present invention.

Referring now to FIG. 2B, an alternative embodiment is shown with the compensation current I3 being injected into node B of input stage 200b. Furthermore, resistor R0 may be coupled to either transistor Q3 or to transistor Q4. It will be appreciated that all transistors in FIGS. 2A and 2B may be either bipolar (BJT) or Field Effect (FET).

Figure 3:
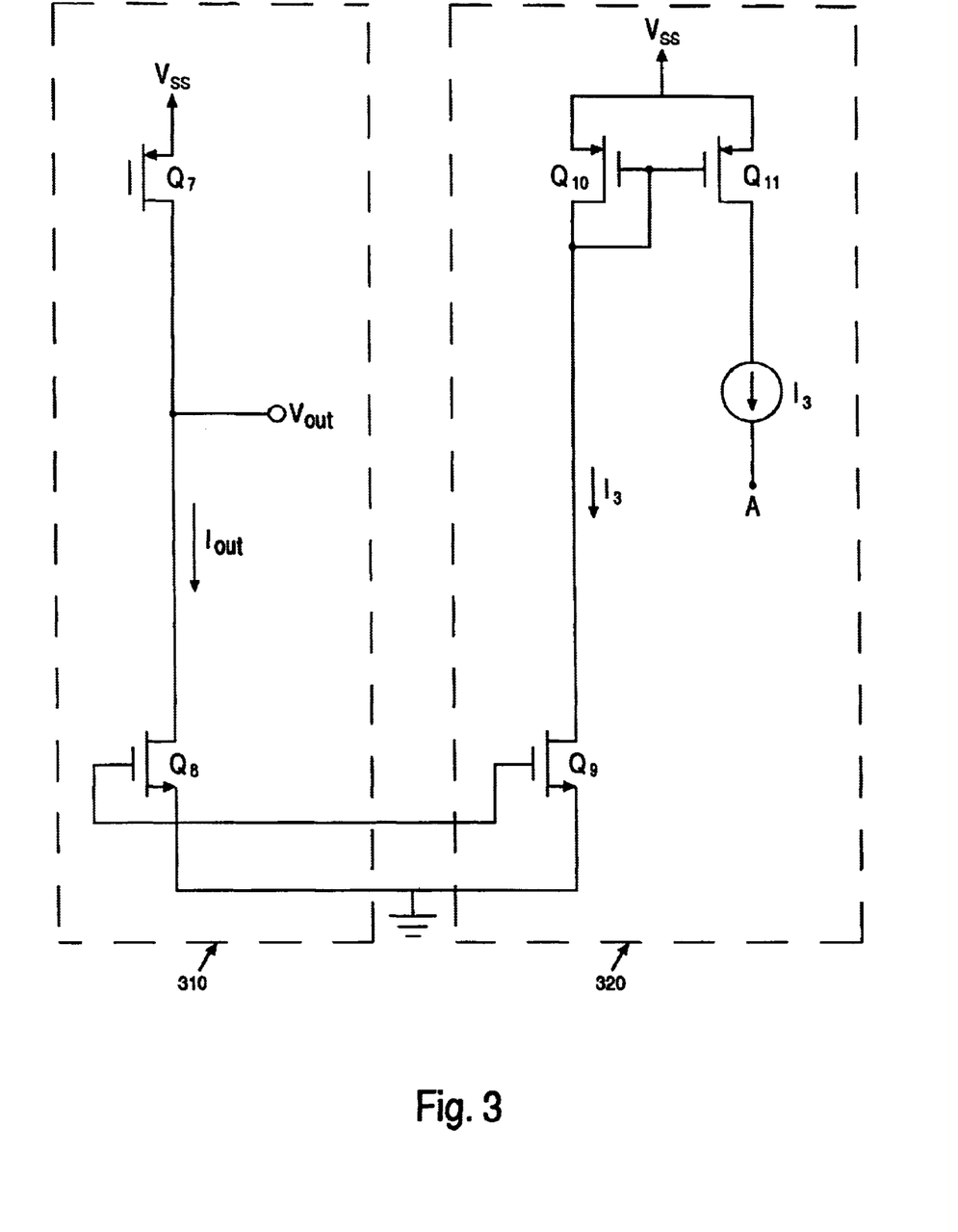
FIG. 3 is a schematic illustration of a compensation scheme for providing a compensation current that is a function of an output current, according to embodiments of the present invention.

Embodiments also provide for a current compensation stage. The purpose of this stage is to create a compensation current that is a function of the output current. For example, the compensation current may be linearly related to the output current. This current, may then be fed into the input stage 200 at node A in FIG. 2A or node B in FIG. 2B, for example. Referring now to FIG. 3, an example of a first current compensation stage 320 coupled to an output stage 310 is shown. The output stage 310 comprises two transistors Q7 and Q8. The output may sink or source a current. As those-of ordinary skill in the art will understand, changes in the amount of current that is being sourced or sunk may affect the voltage at, for example, the drain of Q8. Thus, the output voltage Vout may be forced up or down based on the amount of current that is being sourced or sunk. It will be understood that the output stage 310 may comprise bipolar transistors and may comprise additional transistors, as well as other circuit components. Furthermore, while the embodiment in FIG. 3 shows transistor Q9 sampling an output current that is being sunk, embodiments are well-suited to sampling an output current that is being sourced.

Still referring to FIG. 3, the current compensation stage 320 comprises a transistor Q9, whose gate is coupled to the gate of output transistor Q8. Furthermore, their sources are coupled together. Thus, the current through Q9 will be proportional to the current through transistor Q8. The width to length ratio of Q8 to that of Q9 may be selected to create the desired ratio of compensation current I3 to output current Iout.

FIG. 3 also shows a current mirror formed by transistors Q10 and Q11. The drain of transistor Q11 may be coupled to node A in FIG. 2A, to node B in FIG. 2B, or elsewhere to feed the first compensation current I3 into the input stage 200. In one embodiment, the first compensation current I3 is linearly related to the output current Iout. However, the present invention is not limited to the compensation current I3 being linearly related to the output current Iout. Throughout this application the term output current may be defined as a current flowing through a transistor that is a part of an output stage 310. Transistors Q10 and Q11 may be matched, although this is not required. Thus, it will be understood that the current from transistor Q11 does not necessarily equal the current through transistor Q9.

Figure 4:
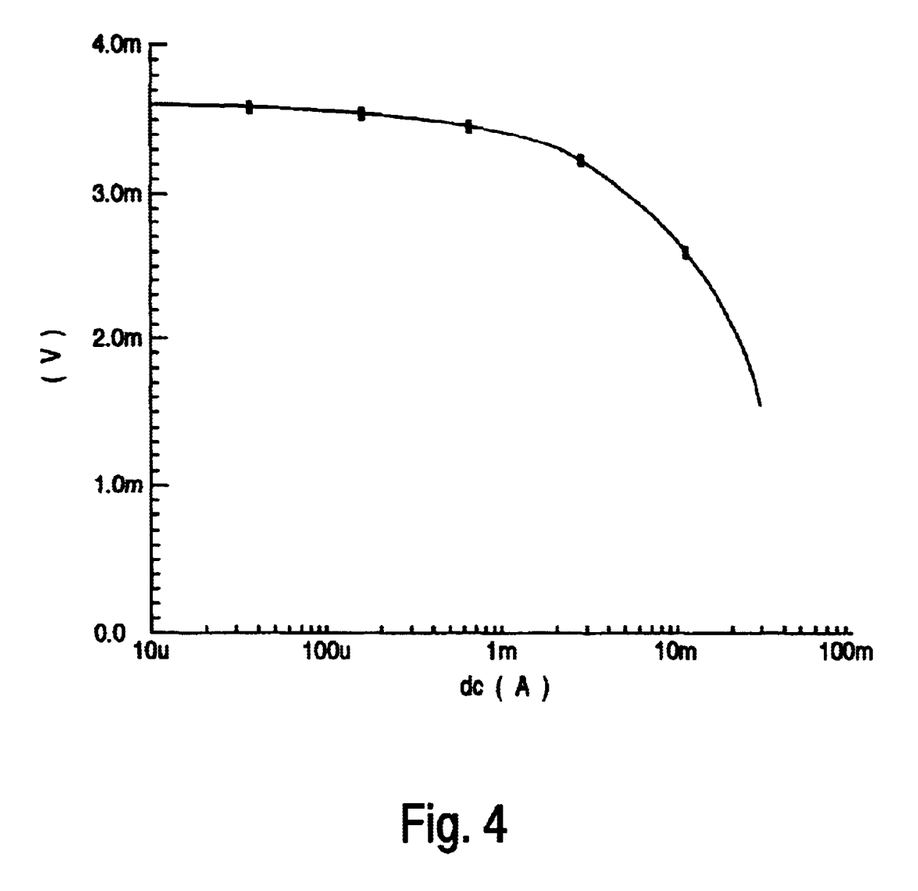
FIG. 4 is a graph illustrating an offset voltage without compensation.

Embodiments of the present invention are able to counter an offset voltage that changes with respect to the output current. Moreover, the effect on offset voltage may have first order effects, second order effects, and even higher order effects. FIG. 4 illustrates an exemplary graph of offset voltage versus output current. The graph may be described as showing a first order and a second order effect. The first order effect is seen when Iout is relatively small, for example, below about 1 mA. As the graph shows, when Iout is at 10 μA the offset voltage is about 3.6 mV. As the output current increases, the offset voltage decreases. At first, the rate of decrease is relatively small. However, the rate of decrease in offset voltage goes up dramatically when the output current is above about 1 mA. Thus, the graph may be described as showing a second order effect when the output current is greater than approximately 1 mA. It will be understood that higher order effects may be described, as well.

In one embodiment, the compensation current I3 may-be used to counter a first order effect. However, if only I3 is used for compensation, then the compensation may become inaccurate if Iout increases beyond, for example, 1 mA. Thus, a second compensation current may be introduced to act jointly with the first compensation current I3 to counter second order effects.

It will be appreciated that the curve in FIG. 4 is exemplary and that embodiments of the present invention are suitable to counter cases in which the offset voltage to output current relationship is otherwise than shown in FIG. 4. Embodiments of the present invention create suitable currents to counter first order, second order, and even higher order effects. Furthermore, while FIG. 4 illustrates a curve in which the offset voltage goes down when the output current goes up, embodiments are well-suited to countering an offset voltage that goes up when the output current goes up.

Furthermore, the two compensation currents may work in the same direction or in opposite directions. For example, suppose the first compensation current (e.g., I3) drives down the positive input terminal relative to the negative input terminal. The second compensation current (e.g., I4) may be configured to either drive down or pull up the positive input terminal relative to the negative input terminal, depending on the compensation needed to counter the offset voltage that is caused by the output current.

Figure 5:
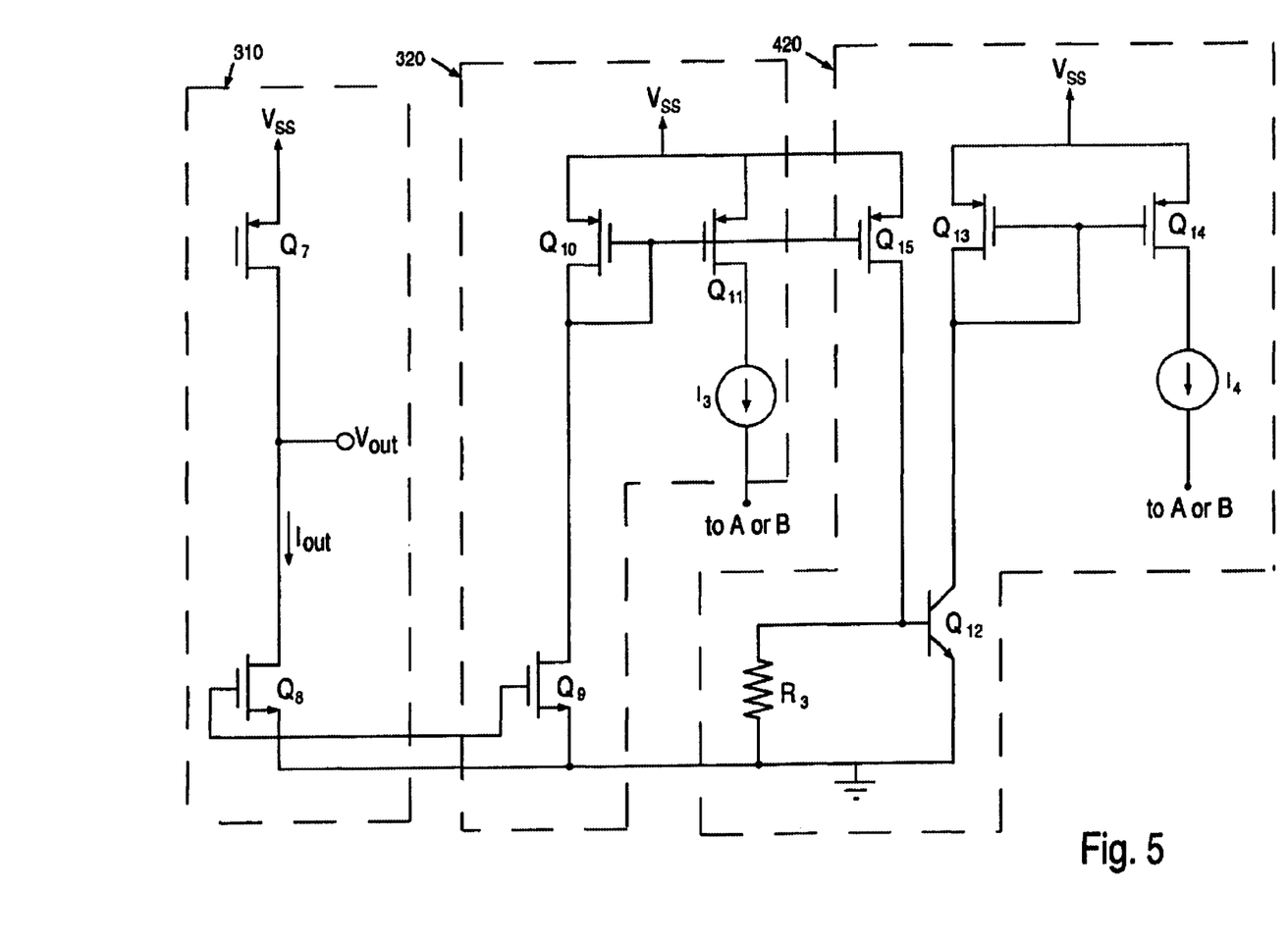
FIG. 5 is a schematic illustration of a compensation scheme to act jointly with a scheme such as FIG. 3 to counter second order effects, according to embodiments of the present invention.

As discussed herein, embodiments provide for the creation of a second compensation current. Referring now to FIG. 5, a second current compensation stage 420 is shown, along with a first current compensation stage 320 and an output stage 310. In one embodiment, the second current compensation stage 420 produces a compensation current I4 that may be exponentially related to the output current Iout. However, the present invention is not limited to the second compensation current I4 being exponentially related to the output current Iout. Any suitable relationship may be created. The relationship between the second compensation current to the output current may be selected based on the characteristics of the offset voltage to output current function.

The second current compensation stage 420 comprises a resistor R3 coupled between the base and emitter of transistor Q12. The first compensation current I3 (or a derivative thereof) feeds the resistor. For example, transistor Q15 feeds a mirrored version of I3 to resistor R3. Transistor Q12 will begin to conduct when approximately 660 mV is across its base-emitter junction. The resistance of R3 is selected to cause Q12 to turn on when the first compensation current I3, and hence the output current is at a pre-determined value. As the current flowing trough Q12 may be given by the equation:

$$I_C = I_S * e^{Vbe/Vt}$$ (Equation 1)

Where Ic is the collector current, is the saturation current, Vbe is the base-emitter voltage, and Vt is the thermal voltage. As equation 1 shows, the collector current is exponential and depends on the base to emitter voltage. Since the base to emitter voltage depends on the current through R3, the current Ic is exponentially related to I3, and; therefore it is exponentially related to the output current. Transistors Q13 and Q14 form a current mirror to direct the compensation current I4 to either node A or B. It will be understood that a current mirror may not be required.

It will be appreciated that variations of FIG. 5 are possible, such as, for example, feeding the output current Iout into resistor R3, instead of current I3. It will also be appreciated that Q12 may be replaced by another circuit element that is operable to produce a current that is exponentially related to Iout. For example, a diode may be used. It will be understood that the present invention is not limited to the second compensation current being exponentially related to the output current. For example, the second compensation current may be approximately linearly related to Iout or otherwise related to Iout. The relationship may be selected to produce a current which is suitable for the characteristics of the output current to offset voltage relationship.

Figure 6:
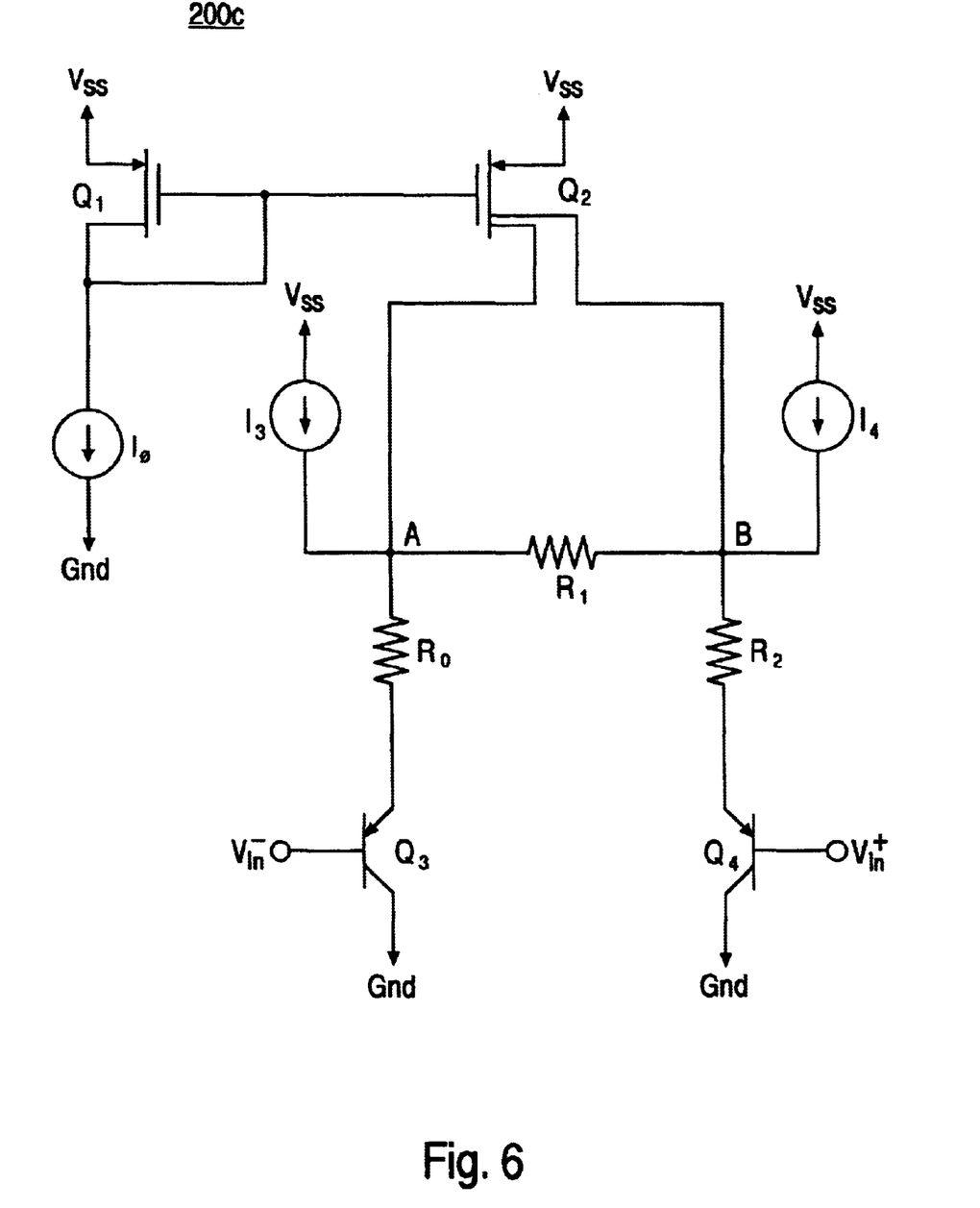
FIG. 6 is a schematic illustration of an input stage showing currents used to counter offset voltages induced by output changes, according to embodiments of the present invention.

Referring now to FIG. 6, an embodiment of an input stage 200c having two compensation currents is shown. The two compensation currents may be, for example, I3 and I4 from FIG. 5. In this embodiment, there are three resistors R0, R1, and R2 between the emitters of transistors Q3 and Q4. It is not required that both I3 and I4 be on at the same time. For example, if the output current is low, it may be that only I3 is being fed into the input stage 200. It will be appreciated that I3 and I4 may both be fed into the same side, for example, both into node B. Also compensation currents I3 and I4 may be exchanged. Thus, embodiments of the present invention may counter offset voltages by selecting which node to inject I3 and I4 into and by selecting suitable resistor values to create the appropriate change in voltage between the input terminals.

Figure 7:
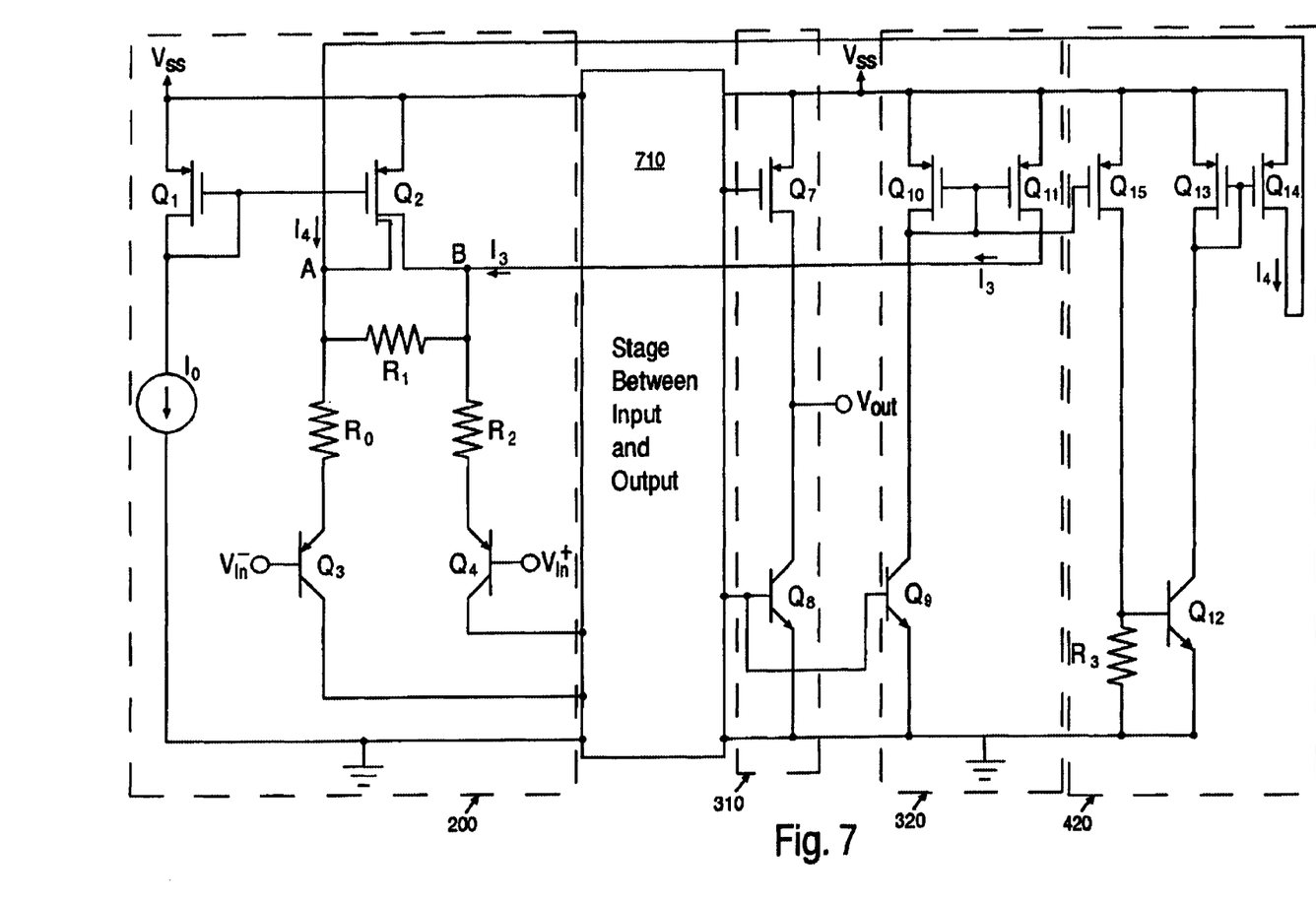
FIG. 7 is a schematic illustration of a circuit with an input stage, an output stage, and first and second current compensation stages, according to embodiments of the present invention.

FIG. 7 illustrates a circuit having an input stage 200, an output stage 320, and two compensation current stages 320, 420. In FIG. 7, the current I3 is shown being fed into node B and I4 is being fed into node A. A stage 710 is shown between the input stage 200 and the output stage 310. It will be appreciated that currents I3 and I4 may be injected into either node A or node B. Furthermore, both currents may be injected into the same node.

Figure 8:
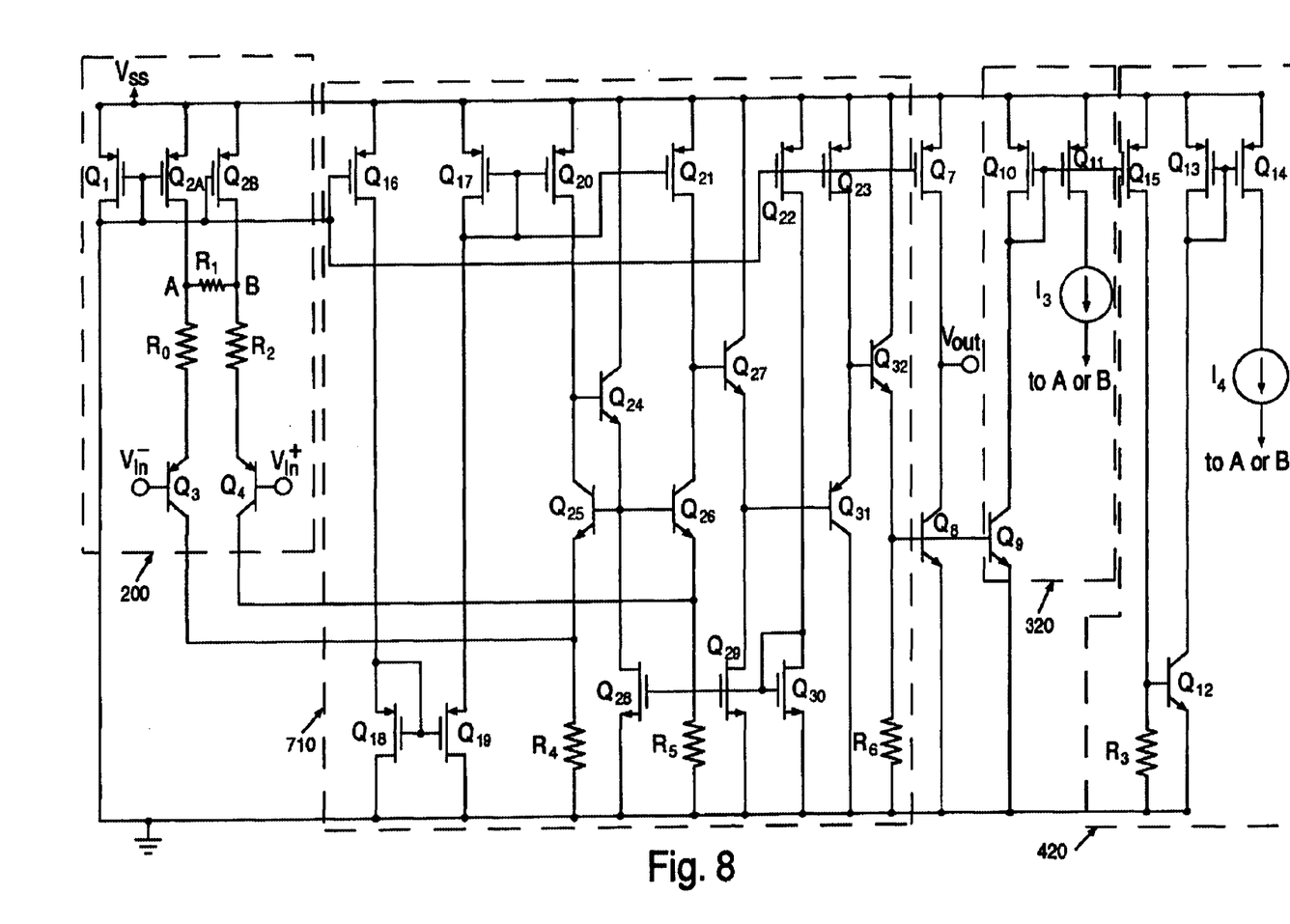
FIG. 8 is a schematic illustration of an exemplary amplifier which uses embodiments of the present invention.

Referring now to FIG. 8, an exemplary circuit is shown. The first compensation current I3 may be fed into either node A or node B. In a similar fashion, the second compensation current I4 may be fed into either node A or node B. The compensation currents may both be fed into the same node or into opposite nodes. By selecting where to inject the compensation currents, as well as selecting appropriate component values, the circuit may be tailored to counter offset voltages with various relationships between output current and offset voltage.

The circuit of FIG. 8 comprises an input stage 200 that is similar to the input stage of FIG. 2A. However, it is shown with two transistors Q2A and Q2B replacing the single transistor Q2 with the double drain. Also shown is an amplifier stage 710 that comprises a transistor Q16 with its gate coupled to the gate of transistor Q1 and to output transistor Q7. The drain of Q16 is coupled to the drain of Q18, which has its source grounded. The gate of Q18 is coupled to the gate of Q19, which has its source grounded. The drain of Q19 is coupled to the drain of transistor Q17. Transistors Q17, Q20, and Q21 have their sources coupled to $V_{ss}$, and have their gates coupled.

The drain of Q20 is coupled to the collector of Q25, which has its emitter coupled to ground through resistor R4. The drain of Q21 is coupled to the collector of Q26, which has its emitter coupled to ground through resistor R5. Transistor Q24 has its collector coupled to $V_{ss}$ and its emitter coupled to the drain of transistor Q28, which has its source coupled to ground. Transistor Q27 has its collector coupled to $V_{ss}$ and its emitter coupled to the drain of transistor Q29, which has its source coupled to ground. The gates of Q8 and Q9 are coupled to the gate of transistor Q30, which has its source coupled to ground. The drain of Q30 is coupled to the drain of transistor Q22. Transistor Q23 and Q22 have their sources coupled to $V_{ss}$ and their gates coupled together and to the gate of output transistor Q7. The drain of Q23 is coupled to the emitter of transistor Q31, which has its collector coupled to ground. The base of Q31 is coupled to the emitter of Q27. Finally, transistor Q32 has its collector coupled to $V_{ss}$, its emitter coupled to ground through resistor R6, its base coupled to the drain of Q23, and its emitter coupled to the gate of output transistor Q8.

The circuit of FIG. 8 also comprises an output stage 310, a first compensation stage 320, and a second compensation stage 320, which have similar components to the analogous stages shown in FIG. 7.

Figure 9A:
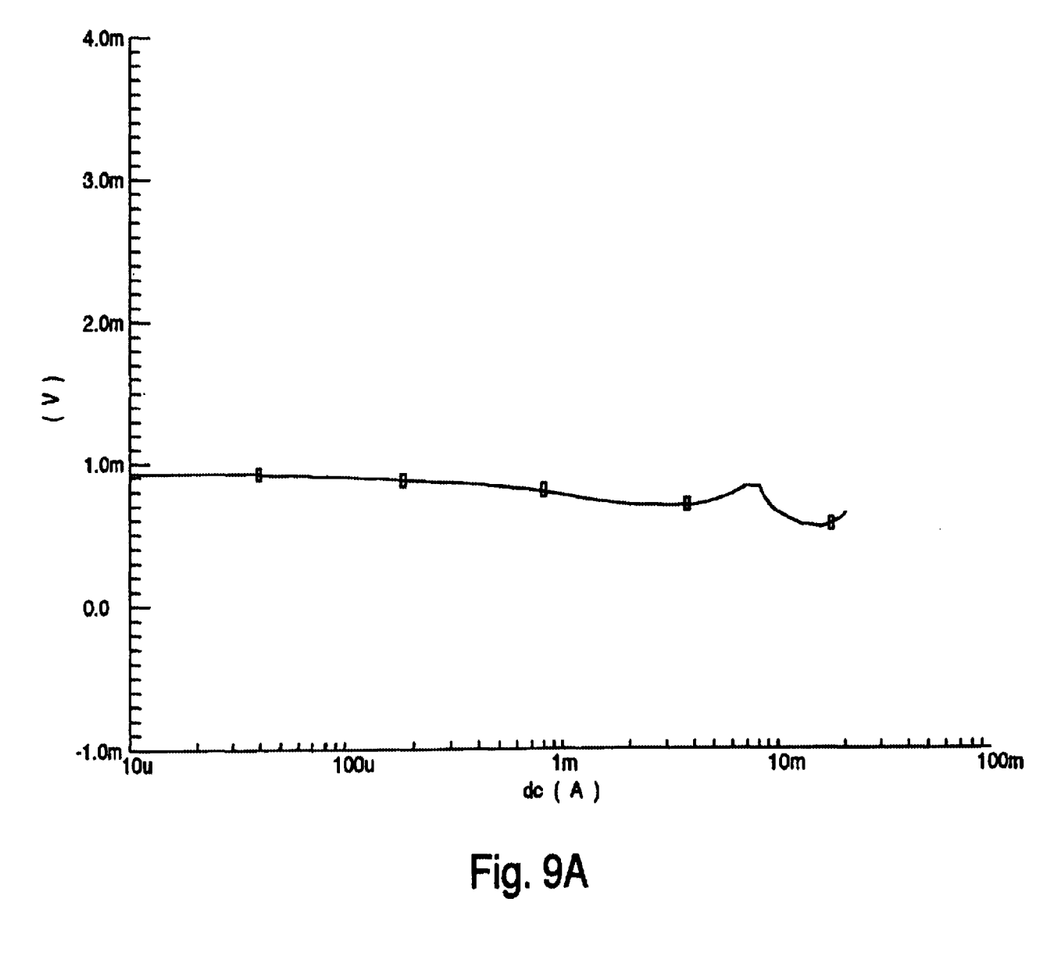
FIGS. 9A and 9B are graphs generated by running circuit simulations of the circuit of FIG. 8, according to embodiments of the present invention.

Referring now to FIG. 9A, the graph illustrates output current being sunk by the amplifier output stage 310 versus compensated offset voltage (e.g., what remains of the offset voltage after compensation). FIG. 9A may be compared with FIG. 4 to see the improvement provided by compensation. The compensated offset voltage may be described as the voltage needed at the input terminals to counter the remaining offset voltage (e.g., $V_{in}^+ - V_{in}^-$). In this example, the offset voltage may be such that the positive input terminal may be described as being at a higher voltage than the negative input terminal. In this example, the first compensation current I3 is injected into node B and the second compensation current I4 is injected into node A. The values used in the simulation for the resistors which may be considered exemplary values, are:

R0=291 Ohms
R1=1191 Ohms
R2=999 Ohms
R3=60 K Ohms
R4=R5=R6=14.25 K Ohm

The ratio of the size of various transistors for this simulation, which may be considered to be exemplary values, are:

Q8:Q9=100:1
Q10:Q11=10:0.6
Q10:Q15=10:1
Q13:Q14=500:1

Figure 9B:
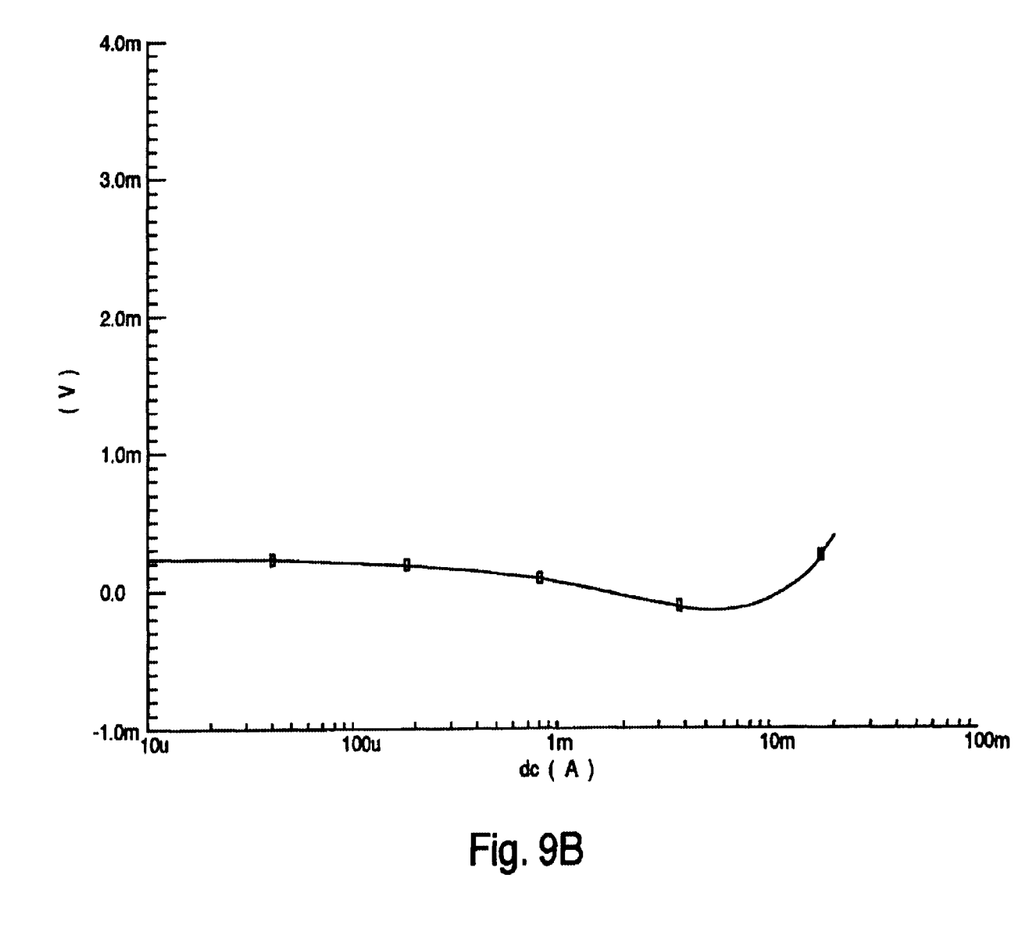

Referring now to FIG. 9B the graph illustrates output current being sunk by the amplifier output stage 310 versus compensated offset voltage (e.g., what remains of the offset voltage after compensation). FIG. 9B may be compared with FIG. 4 to see the improvement provided by compensation. The compensated offset voltage may be described as the voltage needed at the input terminals to counter the remaining offset voltage (e.g., $V_{in}^+ - V_{in}^-$). In this example, the offset voltage may be such that the positive input terminal may be described as being at a lower voltage that the negative input terminal. In this example, both the first compensation current I3 and the second compensation current I4 are injected into node B. The values used in the simulation for the resistors, which may be considered exemplary values, are:

R0=180 Ohms
R1=1191 Ohms
R2=999 Ohms
R3=200 K Ohms
R4=R5=R6=14.25 K Ohm

The ratio of the size of various transistors for this simulation, which may be considered to be exemplary values, are:

Q8:Q9=100:1
Q10:Q11=10:0.4
Q10:Q15=10:2
Q13:Q14=600: 1

It will be appreciated that these simulations are exemplary and that many other configurations are possible. Depending on the nature of the offset voltage to output current function, suitable values are selected for the various resistors and transistor ratios.

Figure 10:
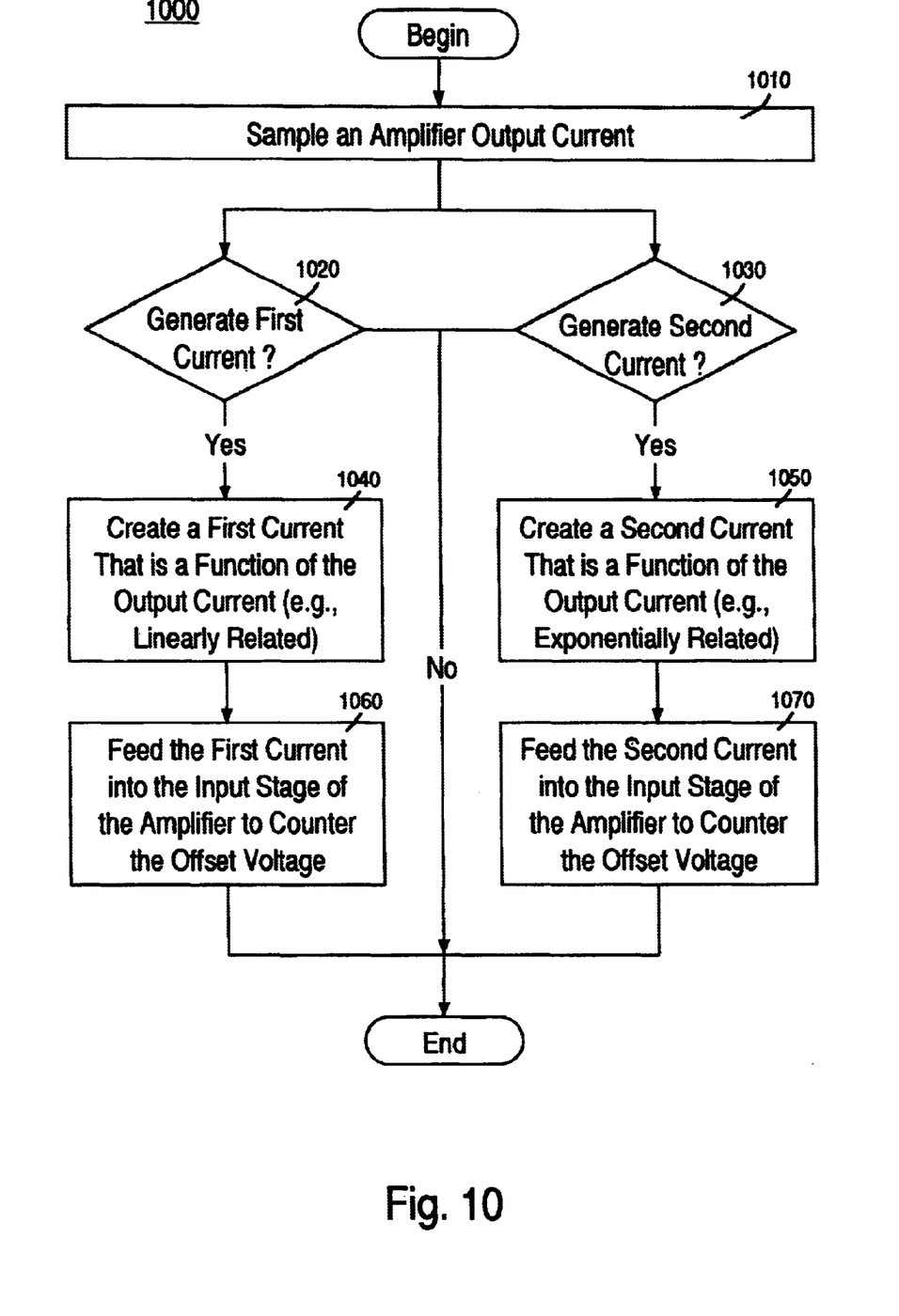
FIG. 10 is a flowchart illustrating steps of a process of countering an offset voltage, according to embodiments of the present invention.

An embodiment of the present invention may be described as a method of countering an offset voltage by injecting compensation currents into an input stage 200. Process 1000 may be described as using current lead regulation to counter an offset voltage. Referring now to FIG. 10, in step 1010 of Process 1000 an amplifier output current is sampled. This may be a current that the output is sourcing or sinking. One method of sampling the output current is shown in FIG. 7, by having a transistor (e.g., Q8) coupled to an output transistor (e.g., Q7) in such a fashion as to be able to respond to the current being sunk or sourced.

The Process 1000 may create compensation currents, depending on 30 the value of the output current. It may be stated that a compensation current is created if the current is desired to counter the offset voltage. Step 1020 represents a decision of whether or not to generate a first compensation current. It will be understood that the decision is automatically made by circuit components. The value and configuration of the components determines whether the current will be generated. In one embodiment, the first compensation current is created by default. However, it is not required that the first compensation current be created for all values on the output current.

Step 1030 represents a decision on whether or not to create a second compensation current. This decision may be automatically made during circuit operation by, for example, choosing component values that cause transistor Q12 to turn on. However, the present invention is not limited to this method of determining to generate a second compensation current.

In step 1040, the first compensation current is generated. This may be accomplished by, for example, the circuit configuration of FIG. 7, in which the bases and emitters of transistors Q8 and Q9 are tied together. However, the present invention is not limited to this method of generating a first compensation current.

Step 1050 is taken if the second compensation current is to be generated. If so, the second compensation current is generated by, for example causing transistor Q12 to turn on. This may be accomplished by feeding any suitable current through resistor R3. In this fashion, the relationship between the second compensation current and the output current may be exponential. However, the present invention is not limited to an exponential relationship.

In step 1060, the first compensation current is fed into the input stage 200 to counter the offset voltage. The offset voltage may be countered by injecting the compensation current into circuit components such as, for example, resistors to raise or lower one input terminal with respect to the other (e.g., to create a compensation voltage between the two input terminals). However, the present invention is not limited to this method of countering the offset voltage by injecting a compensation current into an input stage 200.

Step 1070 is taken if the second compensation current is being used. The first and second compensation currents act jointly to counter the offset voltage. It will be understood that the first and second currents may be both acting in the same direction or may act in opposite directions. Process 1000 then ends. It will be understood that additional compensation currents may be generated and fed into the input stage, if desired.

Therefore, it will be seen that embodiments of the present invention provide a circuit and method for reducing an offset voltage in an operational amplifier. Embodiments provide techniques which compensate for an offset voltage that varies due to changing output loads. Embodiments provide for techniques that do not require increasing the open-loop gain of the amplifier to reduce the effect of the offset voltage. Embodiments provide for techniques that are economical and conserve chip real estate.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit for countering an offset voltage, said circuit comprising:

a first stage having an output current, said offset voltage being related to said output current;

a second stage coupled to said first stage, said second stage operable to produce a first compensation current that is a function of said output current;

a third stage having a first node and a second node which are inputs, said second stage coupled to said third stage to feed said first compensation current into said third stage to create a compensating voltage to counter said offset voltage by altering the voltage between said first node and said second node of said third stage; and a fourth stage, said fourth stage coupled to said second stage, said fourth stage operable to produce a second compensation current that is a function of said output current; and said fourth stage coupled to said third stage to feed said second compensation current into said third stage, said second compensation current operable to act jointly with said first compensation current to counter said offset voltage.

2. The circuit of claim 1, wherein said third stage comprises:

a third node, said third node coupled to said first node of said third stage, said second stage coupled to said third node of said third stage to feed said first compensation current into said third node; and an element between said first node and said third node of said third stage, wherein said first compensation current creates said compensating voltage to counter said offset voltage by at least a portion of said first compensation current flowing through said element.

3. The circuit of claim 1, wherein:

said fourth stage comprises a first element and a second element, said first element coupled to said second stage to receive said first compensation current, said first element coupled to said second element to cause said second element to create said second compensation current in response to the magnitude of said first compensation current.

4. The circuit of claim 1, wherein said third stage comprises:

a third node and a fourth node, said second stage coupled to said third node of said third stage to feed said first compensation current into said third node, said fourth stage coupled to said fourth node of said third stage to feed said second compensation current into said fourth node; and a first element between said first node and said third node and a second element between said second node and said fourth node, wherein said first compensation current and said second compensation currents act jointly to create said compensating voltage to counter said offset voltage by at least a portion of said first compensation current flowing through said first element and at least a portion of said second compensation current flowing through said second element.

5. The circuit of claim 4 further comprising a third element between said third node and said fourth node.

6. The circuit of claim 1, wherein said third stage comprises:

a third node, said second stage coupled to said third node of said third stage to feed said first compensation current into said third node, said fourth stage coupled to said third node of said third stage to feed said second compensation current into said third node; and a first element between said first node and said third node, wherein said first compensation current and said second compensation currents act jointly to create said compensating voltage to counter said offset voltage.

7. A method for countering an offset voltage, said method comprising:

a) sampling an output current of an amplifier, said offset voltage related to said output current;

b) creating a first current that is a function of said output current;

c) feeding said first current created in b) into a first stage of said amplifier to counter said offset voltage;

d) creating a second current that is a function of said output current; and e) feeding said second current into said first stage to act jointly with said first current, wherein said offset voltage is countered.

8. The method of claim 7, wherein said second current in d) is created when said output current reaches a predetermined value, wherein said second current is substantially zero when said output current is below said predetermined level.

9. The method of claim 7, wherein said second current is approximately exponentially related tp said output current.

10. The method of claim 7, wherein said first current is approximately linearly related to said output current.

11. The method of claim 7, wherein said first stage is an input stage.

12. A circuit for reducing offset voltage, said circuit comprising:

a first stage having a first input node and a second input node;

an output transistor having an output current;

a second transistor coupled to said output transistor to produce a second current that is a function of said output current;

said second transistor coupled to said first stage to inject said second current into said first stage, said second current operable to create a compensating voltage to counter said offset voltage by altering the voltage between said first input node and said second input node;

a third transistor;

a first element coupled to said third transistor, said first element coupled to said second transistor to receive said second current, wherein if said second current is sufficiently high, said second current flowing through said first element causes said third transistor to produce a third current that is a function of said output current; and said third transistor coupled to said first stage to inject said third current into said first stage, said third current operable to act jointly with said second current to counter said offset voltage by altering the voltage between said first input node and said second input node.

13. The circuit of claim 12, wherein:

a ratio of the width of said second transistor to the width of said output transistor is chosen to cause said second current to be a fraction of said output current, said fraction selected to cause said second current to reduce said offset voltage.

14. The circuit of claim 12, wherein said first stage comprises:

a fourth transistor having said first input node;

a second element, said second element coupled to said fourth transistor; and said second transistor coupled to said second element, wherein said second current is operable to create said compensating voltage to counter said offset voltage.

15. The circuit of claim 14, wherein:

said third transistor is coupled to said second element, wherein said third current is operable to act jointly with said second current to create said compensating voltage to counter said offset voltage.

16. The circuit of claim 14, wherein said first stage further comprises:

a fifth transistor having said second input node;

a third element, said third element coupled to said fifth transistor; and said third transistor coupled to said third element, wherein said third current is operable to act jointly with said second current to create said compensating voltage to counter said offset voltage.

17. The circuit of claim 16, wherein said first stage comprises:

a fourth element coupled to said second element and said third element.

18. The circuit of claim 17, wherein said first, second, third, and fourth elements are resistors.

* * * * *